United States Patent [19]
Uchiyama

[11] Patent Number: 5,594,278
[45] Date of Patent: Jan. 14, 1997

[54] SEMICONDUCTOR DEVICE HAVING A VIA HOLE WITH AN ASPECT RATIO OF NOT LESS THAN FOUR, AND INTERCONNECTIONS THEREIN

[75] Inventor: Tomoyuki Uchiyama, Tokyo, Japan

[73] Assignee: Nippon Steel Corporation, Tokyo, Japan

[21] Appl. No.: 425,484

[22] Filed: Apr. 20, 1995

[30]  Foreign Application Priority Data

Apr. 22, 1994 [JP] Japan ................................. 6-108002

[51] Int. Cl.$^6$ .......................... H01L 23/522; H01L 29/41; H01L 29/43
[52] U.S. Cl. .......................... 257/751; 257/763; 257/764; 257/915; 257/758
[58] Field of Search .................................. 257/751, 752, 257/758–760, 763, 764, 765, 773, 774, 915

[56]  References Cited

U.S. PATENT DOCUMENTS 4,767,724  8/1988  Kim et al. .............................. 257/760
5,202,579  4/1993  Fujii et al. ............................. 257/763
5,272,110  12/1993  Koyama .................................. 437/190

FOREIGN PATENT DOCUMENTS 0430403  6/1991  European Pat. Off. ................ 257/915
0524818  1/1993  European Pat. Off. ................ 257/774
0068952  3/1990  Japan .

Primary Examiner—Peter Toby Brown
Attorney, Agent, or Firm—Pollock, Vande Sande & Priddy

[57]  ABSTRACT

A semiconductor device includes an inter-level insulating film formed on a semiconductor substrate. Wiring layers are formed at different depths inside the interlevel insulating film. Open aperture portions have different depths and are formed in the inter-level insulating film so as to reach each of the wiring layers. A titanium nitride film (first conductor layer) is formed on the inner surface of each of the open aperture portions and on the inter-level insulating film. A silicon oxide film (insulating film) is formed on the titanium nitride film and hardly on the inner surface of each of the open aperture portions. A tungsten film (second conductor layer) is formed inside each of the open aperture portions. An aluminum wiring (third conductor layer) is formed on the tungsten film.

15 Claims, 3 Drawing Sheets

SEMICONDUCTOR DEVICE HAVING A VIA HOLE WITH AN ASPECT RATIO OF NOT LESS THAN FOUR, AND INTERCONNECTIONS THEREIN

FIELD OF THE INVENTION

This invention relates to a semiconductor device and a lubrication method thereof. More particularly, the present invention relates to a semiconductor device suitable to the formation of wirings inside a contact hole and to a fabrication method of such a semiconductor device.

BACKGROUND OF THE INVENTION

An integration density and an operation speed of semiconductor devices, such as integrated circuits, have become higher and higher in recent years, and a multi-layered wiring structure has been employed to satisfy these requirements. When wirings are laminated in a vertical direction through an inter-level insulating film, such as a silicon oxide film in this multi-layered wiring structure, open aperture portions referred to as "contact holes" or "via-holes" are formed in the inter-level insulating film. This is done to electrically connect the wirings with one another or the wirings with the silicon substrate by burying the wiring films into the open aperture portions. To bury the wiring films into the open aperture portions, a wiring formation by the selective growth method is generally used (e.g. JP-A-2-68952).

In the wiring formation by this selective growth method, however, the growth of the conductor, such as tungsten, proceeds from only the upper surface of the wiring layers. Thus, the affinity between the conductor and the inter-level insulating film on the inner side surface of the open aperture portion is so poor that it is difficult for the conductor to be inserted into the open aperture portion. Consequently, cavities or the snapping of wires may occur in the open aperture portion. Further, in case there is an open aperture portion having a smaller depth and an open aperture portion having a greater depth for example, a tungsten film cannot be completely buried into the open aperture portion having a greater depth if the film formation time of the tungsten film is set to the open aperture portion having a smaller depth. If the film formation time of the tungsten film is set to the open aperture portion having a greater depth, on the other hand, the tungsten film is deposited at an excessive film thickness to the open aperture portion having a smaller depth. In order words, this wiring formation method is not void of the problems since the tungsten films cannot be uniformly buried into both open aperture portions if they have different depths.

SUMMARY OF THE INVENTION

It is an object of the present invention to provide a semiconductor device having a structure in which it is difficult for cavities and the snapping of wires in an open aperture portion to occur even if the open aperture portion has a smaller diameter.

It is another object: of the present invention to provide a semiconductor device having a structure in which a conductor, such as tungsten, can be uniformly buried into open aperture portions having different depths even when a wiring formation using a selective growth method is employed to fabricate the semiconductor device.

It is further another object of the present invention to provide a method of fabricating a semiconductor device having a structure in which a conductor, such as tungsten, can be uniformly buried into open aperture portions having different depths even when a wiring formation method of a selective growth is employed.

A first semiconductor device according to the present invention includes a semiconductor device in which an inter-level insulating film is formed on a semiconductor substrate, and comprises:

a wiring layer formed in the inter-level insulating film;

an open aperture portion formed in the inter-level insulating film in such a manner as to reach the wiring layer;

a first conductor layer formed on an inner surface of the open aperture portion and on the inter-level insulating film;

an insulating film formed on the first conductor layer other than the first conductor layer formed on the inner surface of the open aperture portion; and a second conductor layer formed inside the open aperture portion.

A second semiconductor device according to the present invention includes a semiconductor device in which an inter-level insulating film is formed on a semiconductor substrate, and comprises:

at least two wiring layers formed in the inter-level insulating film;

at least two open aperture portions having different depths and formed in the interlevel insulating film to reach each of the wiring layers;

a first conductor layer formed on an inner surface of each of the open aperture portions and on the inter-level insulating film;

an insulating film formed on the first conductor layer other than the first conductor layer formed on the inner surface of each of the open aperture portions; and a second conductor layer formed inside each of the open aperture portions.

A method of fabricating a semiconductor device according to the present invention includes fabricating a semiconductor device in which an inter-level insulating film is formed on a semiconductor substrate, and comprises the steps of:

forming a wiring layer in the inter-level insulating film;

forming an open aperture portion in the inter-level insulating film to reach the wiring layer;

forming a first conductor layer on an inner surface of the open aperture portion and on the inter-level insulating film by chemical vapor deposition;

forming an insulating film on the first conductor layer other than the first conductor layer formed on the inner surface of the open aperture portion by sputtering;

forming a second conductor layer inside the open aperture portion by chemical vapor deposition; and forming a third conductor layer on the second conductor layer.

DESCRIPTION OF THE PREFERRED EMBODIMENTS

Figure 1A:
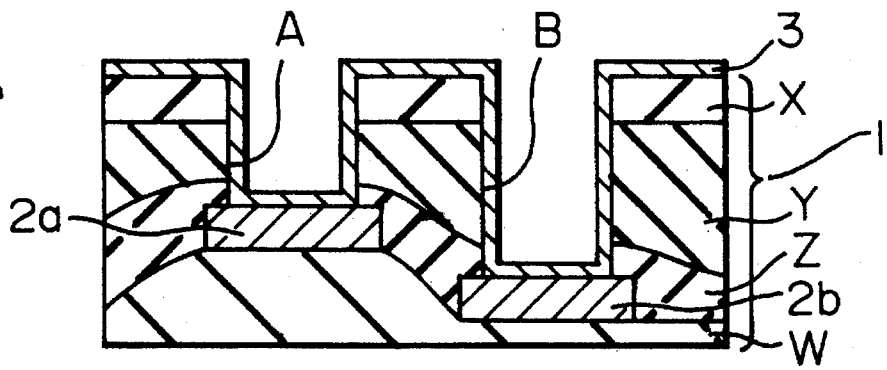
FIGS. 1A to 1D are sectional views of viable portions, and show, in a step-wise fashion, a wiring formation method of a semiconductor device according to one embodiment of the present invention.

A semiconductor device according to an embodiment of the present invention will be explained with reference to FIGS. 1A–1D. As shown in FIG. 1D, the semiconductor device of this embodiment includes an inter-level insulating film 1 formed on a semiconductor substrate (not shown); wiring layers 2a, 2b formed at positions having different depths in the inter-level insulating film 1; open aperture portions A, B formed in the inter-level insulating film 1 at different depths in such a manner as to reach the wiring layers 1a, 1b, respectively; a titanium nitride film (first conductor layer) 3 which is formed on the exposed parts of the wiring layers 1a, 2b, on the inner side surfaces of the open aperture portion A, B and on the inter-level insulating film 1; a silicon oxide film (insulating film) 4 formed on the titanium nitride film 3 at portions other than the titanium nitride film 3 formed on the inner surface of each open aperture portion A, B; tungsten films 5a, 5b (second conductor layer) formed in the open aperture portions A, B, respectively; and an aluminum wiring 6 (third conductor layer) formed on the tungsten films 5a, 5b.

The inter-level insulating film 1 comprises an insulating film W formed below the wiring layers 2a, 2b, a first plasma oxidation film Z formed on the insulating film W so as to cover the wiring layers 2a, 2b, an SOG (Spin On Glass) film Y formed on the first plasma oxidation film Z and a second plasma oxidation film X formed on the SOG film Y. IN other words, the inter-level insulating film 1 is made flat by sandwiching the SOG film Y between the first and second plasma oxidation films Z and X.

Next, a wiring formation method according to one embodiment of a semiconductor device fabrication method of the present invention will be explained with reference to FIGS. 1A to 1D, 2 and 3. After the insulating film W is formed on the semiconductor substrate (not shown), as shown in FIG. 1A, the wiring layers 2a, 2B are formed on this insulating film W. Subsequently, the first plasma oxidation film Z is formed on the insulating film W so as to cover the wiring layers 2a, 2b, and then the SOG film Y is formed on the first plasma oxidation film Z. Next, the second plasma oxidation film X is formed on the SOG form Y. As a result. the inter-level insulating film 1 comprising the insulating film W, the first plasma oxidation film Z, the SOG film Y and the second plasma oxidation film X is formed on the semiconductor substrate, and two wiring layers 1a, 2b are formed in the inter-level insulating film 1. At this time, the inter-level insulating film 1 is made flat as the SOG film Y is sandwiched between the first plasma oxidation film Z and the second plasma oxidation films X. Subsequently, the open aperture portions A, B having different depths are formed in the inter-level insulating film 1 so as to reach the wiring layers 2a, 2b. The open aperture portions A, B have a diameter of about 0.5 μm and depths of about 2.0 to 2.g μm. The wiring layers 1a, 2b extend in a direction perpendicular to the sheet of the drawings, and the open aperture portions A, B are formed at the upper part of the wiring layers 2a, 2b. An about 100 m-thick titanium nitride film 3 (first conductor layer) is formed by a chemical vapor deposition (CVD) method on the inner surface (bottom surface and side surface) of each open aperture portion A, B and on the inter-level insulating film 1.

Figure 1B:
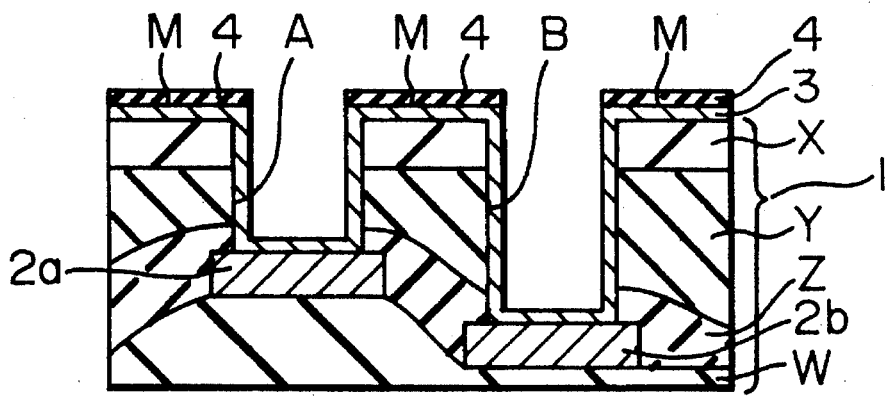
Figure 2:
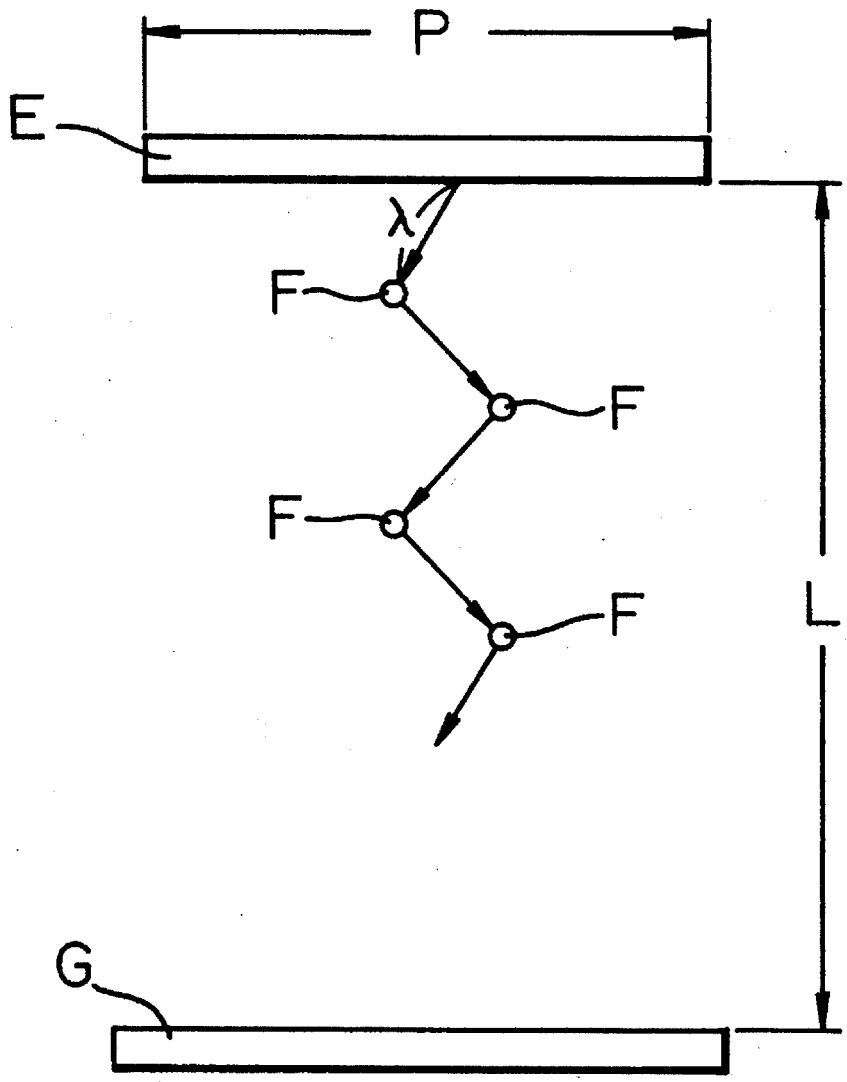
FIG. 2 is a conception view for explaining a mean free path λ of a silicon atom when an insulating film is formed by sputtering.

Next, as shown in FIG. 1B, an about 20 m-thick silicon oxide film 4 insulating film) is formed by sputtering on only the upper surface M of the titanium nitride film 3. In other words, the silicon oxide film 4 is hardly formed on the titanium nitride film 3 which is formed on the inner surface of each open aperture portion A, B. This sputtering is carried out by using a target E of polycrystalline silicon in an oxidizing atmosphere, as shown in FIG. 2. The sputtering condition is as follows. Argon is used as a discharge gas at about 30° C. without heating the substrate G, a sputtering gas pressure is 100 mTorr, power is 1 KW, the distance L between the target E and the substrate G is 5 cm and the diameter P of the target is 30 cm. Whereas the CVD method forms a thin film by utilizing a surface chemical reaction, the sputtering method deposits physically the silicon atoms F emitted from the target E on the substrate G. Accordingly, in comparison with the CVD method, the sputtering method provides lower coverage on the inner surface of the open aperture portions A, B such as via-holes. This tendency becomes all the more dominant as the aspect ratio of each open aperture portion A, B becomes greater. Therefore, when the silicon oxide film 4 is formed on the upper surface M of the titanium nitride film 3 by using the sputtering method, the silicon oxide film 4 is hardly deposited on the inner surface of the open aperture portions A, B, so that the silicon oxide film 4 can be formed on only the upper surface M of the titanium nitride film 3.

Hereafter, coverage of the silicon oxide film 4 on the inner surface of the open aperture portions A, B by the sputtering method will be quantitatively explained.

In FIG. 2, the silicon atom F emitted from the target E causes a linear motion. At the point of time when the silicon atom F has moved by a predetermined distance, it impinges on the argon ion. The mean value λ of the distances of the silicon atoms F till collision with the argon atoms (that is, mean free path λ) is expressed by the following formula (1) where the gas pressure inside a chamber (not shown) is P, the internal temperature of the chamber is T [K] and the diameter of the argon atom is:

$$\lambda = 2.33 \times 10^{-20} \times T/(P \times D^2) \ [cm] \qquad (1)$$

In this embodiment, T=300 [K], P=0.1 [torr] and D=3.67×$10^{-8}$ [cm]. Therefore, when these values are substituted for the equation 91), the mean free path λ of the silicon atom F is 0.05 [cm]. Because the distance L between the target E and the substrate G is set to 5 [cm], the silicon atom F emitted from the target E repeats 100 times on average in the collision with the argon ion. As a result, the direction of incidence of the silicon atom F into the substrate G can be made completely random.

The film formation rate is proportional to a solid angle Ω which is determined by looking at the target E from the film formation point. Therefore, the film formation rates S (top) and S (bottom) at the point $K_2$ at the upper part of the open aperture portion B having an aspect ration of "2" on the center of the substrate G shown in FIG. 3 and at the point $K_1$ at the bottom thereof are expressed by the following equations (2), (3), respectively:

$$S(\text{top}) = A \cdot \Omega(\text{top}) = A \cdot \left( \int_0^{\tan^{-1}3} 2\pi R_1^2 \sin(\theta)\, d\theta \right) / R_1^2 \quad (2)$$

$$S(\text{bottom}) = A \cdot \Omega(\text{bottom}) = A \cdot \left( \int_0^{\tan^{-1}0.25} 2\pi R_2^2 \sin(\theta)\, d\theta \right) / R_2^2 \quad (3)$$

Figure 3:
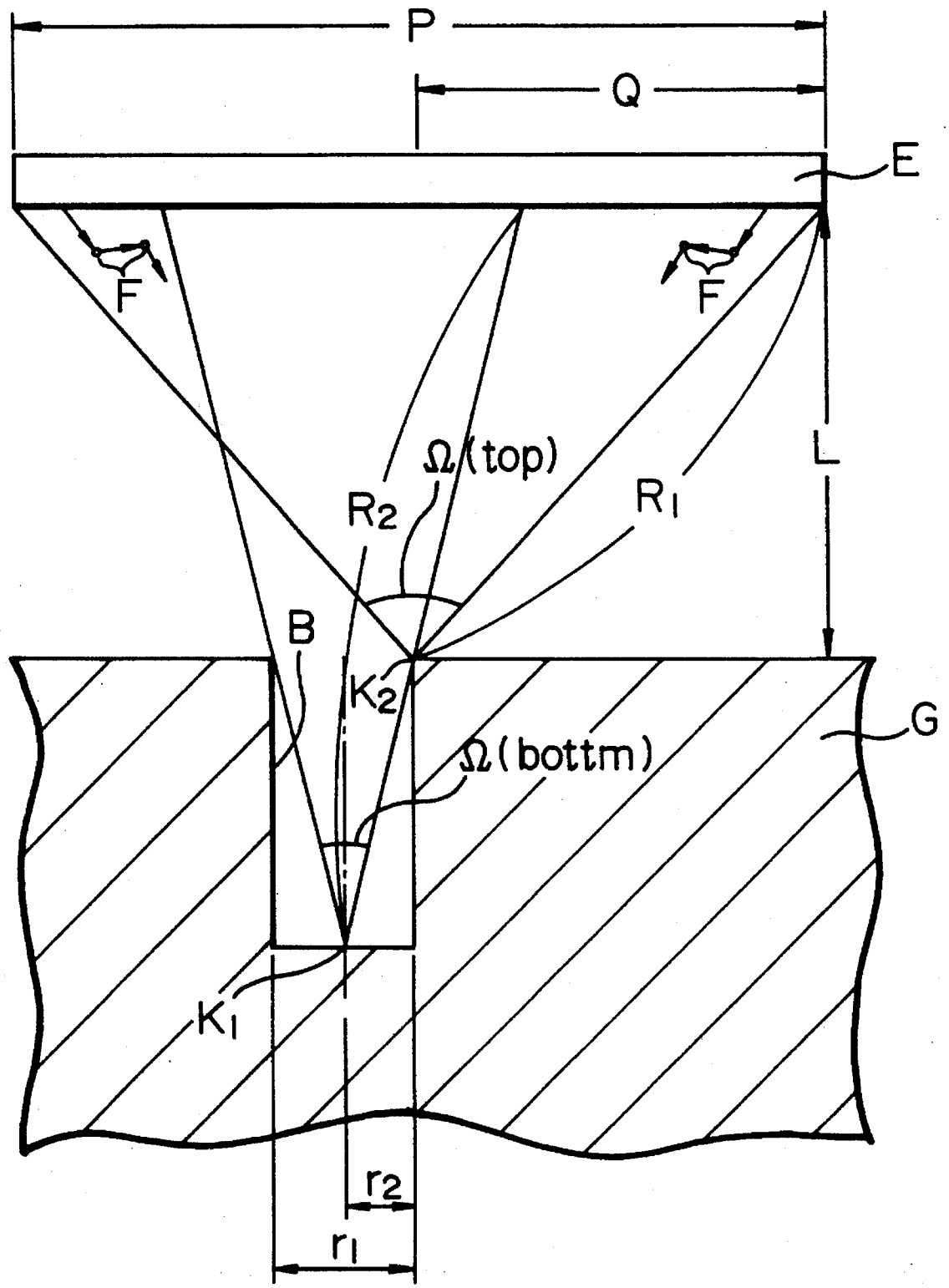
FIG. 3 is a conception view for explaining the process of forming an insulating film grown at open aperture portions and on the surface of a substrate when the insulating film is formed by sputtering.

Here, A is a constant, $\Omega$ (top) is a solid angle which is determined by looking at the target E from the point $K_2$ on the surface of the substrate G shown in FIG. 3, and $\Omega$ (bottom) is a solid angle which is determined by looking at the upper end portion of the open aperture portion B from the point $K_1$ at the bottom of the open aperture portion B shown in FIG. 3. $R_1$ is the ridge of the solid angle $\Omega$ (top) and $R_2$ is the ridge of the solid angle $\Omega$ (bottom).

Assuming that the diameter $r_1$ of the open aperture portion B is 0.5 µm (that is, the radius $r_2$ of the open aperture portion B is 0.25 µm), the distance L between the target E and the substrate G is 5 cm and the diameter P of the target E is 30 cm (that is, the radius $\Omega$ of the target E is 15 cm), the film formation rate S (top) at the point $K^2$ at the upper part of the open aperture portion B is 4.3·A because the integration in the equation (2) is made from 0 to $\tan^{-1}3$, and the film formation rate S (bottom) at the point $K_1$ of the bottom of the open aperture portion B is 0.18·A because the integration in the equation (3) is made from 0 to $\tan^{-1}0.25$. As a result, the film formation rate S (bottom) at the point $K_1$ of the bottom of the open aperture portion B is 1/24 of the film formation rate S (top) of the point $K_2$ at the upper part of the open aperture portion B. The ratio of the, growth rate at the point $K_2$ at the upper part of the open aperture portion B to the growth rate at the point $K_1$ of the portion thereof increases with an increasing aspect ratio of the open aperture portion B. Accordingly, as shown in FIG. 1B, the silicon oxide film 4 is hardly deposited on the inner surfaces of the open aperture portions A, B, but is substantially formed on the upper surface M of the titanium nitride film 1.

Figure 1C:
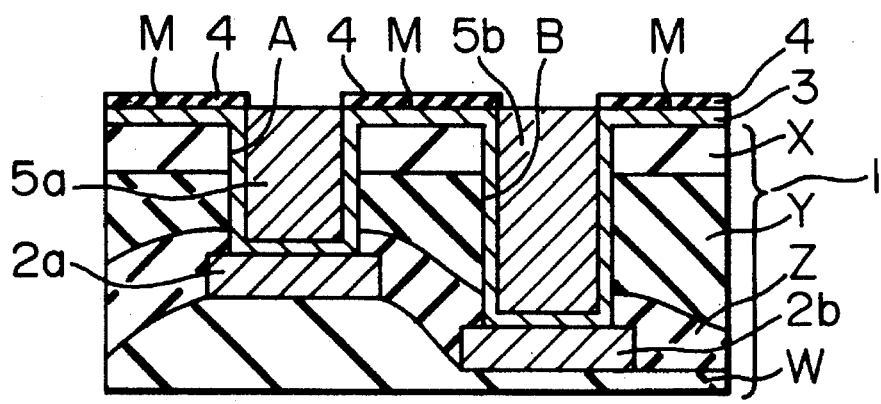
Figure 1D:
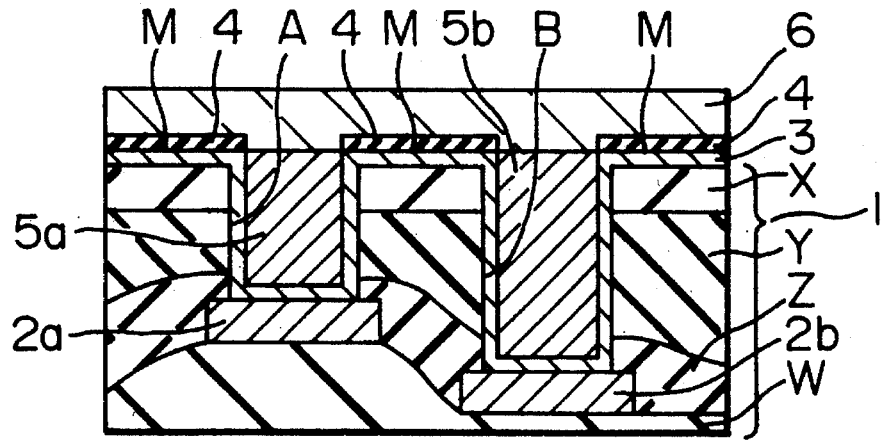

Next, as shown in FIG. 1C, the tungsten films 5a, 5b (second conductor layer) are selectively formed inside the open aperture portions A, B by the chemical vapor deposition method, respectively. At this time, since the titanium nitride film 3 covers the inner surfaces (bottom surface and side surface) of the open aperture portions A, B, the tungsten films 5a, 5b uniformly grow inside the open aperture portions A, B. Accordingly, even when the depths of the open aperture portions A, B are different, the tungsten films 5a, 5b can be uniformly buried into each open aperture portions A, B. Because the silicon oxide film 4 is formed on the surface of the upper portion on the inter-level insulating film 1 and because the tungsten films 5a, 5b hardly grow on the insulating film, the tungsten films 5a, 5b are not deposited on the upper surface on the inter-level insulating film 1. Incidentally, the film formation time of the tungsten films 5a, 5b is set to the time which is calculated from the deposition rate from the side wall of the open aperture portions A, B to the center of the open aperture portions A, B.

Next, an about 800 nm-thick aluminum wiring 6 (third conductor layer) is formed on the tungsten films 5a, 5b and on the inter-level insulating film 1 by the CVD method or the sputtering method.

The semiconductor device according to the present invention and its fabrication method have thus been described with reference to the embodiment thereof, but a silicon nitride film, a titanium oxide film, an aluminum oxide film or an aluminum nitride film may be used in place of the silicon oxide film 4, and a TiW film may be used as the first conductor layer in place of the titanium nitride film 3.

Further, although the tungsten films 5a, 5b are used as the second conductor layer, metals, the resistance values of which are smaller than that of tungsten, such as aluminum, may be used as the material of the second conductor layer.

According to the present invention, the first conductor layer is formed only on the bottom and the side surface of the open aperture portion in exposed manner and then the second conductor layer is buried into the open aperture portion. Therefor, the second conductor layer can be uniformly buried into the open aperture portion regardless of the depth thereof, so that even when the second conductor layer is buried into the open aperture portions having a different depth, the etch-back step using a halogen type gas is not necessary and the problems, such as the peeling due to damage of the remaining film and corrosion of aluminum used for the wiring by the halogen substances remaining in the remaining film can be prevented. In other words, the present invention can accomplish high quality and long service life of the wiring film.

What is claimed is:

1. A semiconductor device in which an inter-level insulating film is formed on a semiconductor substrate, comprising:

a wiring layer formed in said inter-level insulating film;

an open aperture portion formed in said inter-level insulating film in such a manner as to reach said wiring layer, wherein said open aperture portion has an aspect ratio of not less than four;

a first conductor layer formed on an inner surface of said open aperture portion and on said inter-level insulating film;

an insulating film formed on said first conductor layer, wherein a thickness of said insulating film formed over the inner surface of said open aperture portion is substantially negligible; and a second conductor layer selectively formed inside said open aperture portion.

2. A semiconductor device according to claim 1, further comprising a third conductor layer formed on said second conductor layer.

3. A semiconductor device according to claim 1, further comprising a plurality of open apertures having different depths.

4. A semiconductor device according to claim 1, wherein said first conductor layer comprises a conductor layer selected from titanium nitride and titanium-tungsten.

5. A semiconductor device according to claim 1, wherein said second conductor layer comprises a conductor layer selected from tungsten and aluminum.

6. A semiconductor device according to claim 1, wherein said third conductor layer comprises a conductor layer of aluminum.

7. A semiconductor device according to claim 1, wherein said insulating film comprises a film selected from a silicon oxide film, a silicon nitride film, a titanium oxide film, an aluminum oxide film, and an aluminum nitride film.

8. A semiconductor device according to claim 1, wherein said first conductor layer is formed on a part of said wiring layer which forms an inner bottom surface of said open aperture portion, on an inner side surface of said open aperture portion formed by said interlevel insulating film, and on said inter-level insulating film.

9. A semiconductor device in which an inter-level insulating film is formed on a semiconductor substrate, comprising:

at least two wiring layers formed in said inter-level insulating film;

at least two open aperture portions having different depths and aspect ratios of not less than four, and formed in said inter-level insulating film in such a manner as to reach said wiring layers, respectively;

a first conductor layer formed on an inner surface of each of said open aperture portions and on said inter-level insulating film;

an insulating film formed on said first conductor layer, wherein a thickness of said insulating film formed over the inner surface of each of said open aperture portions is substantially negligible;

a second conductor layer selectively formed inside each of said open aperture positions.

10. A semiconductor device according to claim 9, further comprising a third conductor layer formed on said second conductor layer.

11. A semiconductor device according to claim 9, wherein said first conductor layer comprises a conductor layer selected from titanium nitride and titanium-tungsten.

12. A semiconductor device according to claim 9, wherein said second conductor layer comprises a conductor layer selected from tungsten and aluminum.

13. A semiconductor device according to claim 9, wherein said third conductor layer comprises a conductor layer of aluminum.

14. A semiconductor device according to claim 9, wherein said insulating film comprises a film selected from a silicon oxide film, a silicon nitride film, a titanium oxide film, an aluminum oxide film, and an aluminum nitride film.

15. A semiconductor device according to claim 9, wherein said first conductor layer is formed on a part of said wiring layer which forms an inner bottom surface of said open aperture portion, on an inner side surface of said open aperture portion formed by said interlevel insulating film, and on said inter-level insulating film.

* * * * *